US008014545B2

(12) United States Patent
Grant et al.

(10) Patent No.: US 8,014,545 B2
(45) Date of Patent: Sep. 6, 2011

(54) CEILING OR WALL-MOUNTED LOUDSPEAKER SYSTEM WITH ANTI-DIFFRACTION WAVE LAUNCH DEVICE

(75) Inventors: Matthew Grant, Arnprior (CA); Timothy A. Gladwin, Pakenham (CA); Robert G. Johnston, Arnprior (CA)

(73) Assignee: DEI Headquarters, Inc., Vista, CA (US)

( * ) Notice: Subject to any disclaimer, the term of this patent is extended or adjusted under 35 U.S.C. 154(b) by 1230 days.

(21) Appl. No.: 11/641,446

(22) Filed: Dec. 18, 2006

(65) Prior Publication Data

US 2008/0144873 A1 Jun. 19, 2008

(51) Int. Cl.
*H04R 25/00* (2006.01)
*H05K 5/00* (2006.01)
*A47B 81/06* (2006.01)

(52) U.S. Cl. ........ 381/160; 381/152; 381/182; 381/186; 181/150; 181/155; 181/156; 181/199

(58) Field of Classification Search .......... 381/350–354, 381/160, 182, 186, 162; 181/155, 156, 144–147, 181/199
See application file for complete search history.

(56) References Cited

U.S. PATENT DOCUMENTS

| | | | | |
|---|---|---|---|---|
| 4,421,200 | A * | 12/1983 | Ferralli et al. | 181/144 |
| 6,134,332 | A * | 10/2000 | Wiener | 381/160 |

* cited by examiner

*Primary Examiner* — Curtis Kuntz
*Assistant Examiner* — Sunita Joshi
(74) *Attorney, Agent, or Firm* — KC Bean; Bean Law Office

(57) ABSTRACT

A loudspeaker system includes an enclosure having an open end defining a plane, a baffle, a loudspeaker operating in the 4 kHz to 10 kHz range, and a device, preferably a ribbed portion having a plurality of grooves, coupled to the baffle for modifying the spectral profile of the projected sound waves. The baffle includes first and second angled surfaces each oriented at an oblique angle with respect to the plane. The speaker is coupled to the first angled surface and the ribbed portion is coupled to the baffle along the intersection of the first angled surface and the second angled surface. When mounted in a wall or ceiling, the system projects a sound field substantially indistinguishable from that of a loudspeaker located within the listener's listening plane. The baffle can also have acoustic damping material attached thereto, with grooves formed therein, to prevent reflections of 4 kHz to 10 kHz sound.

20 Claims, 10 Drawing Sheets

CEILING OR WALL-MOUNTED LOUDSPEAKER SYSTEM WITH ANTI-DIFFRACTION WAVE LAUNCH DEVICE

FIELD OF THE INVENTION

The embodiments of the present invention relate generally to loudspeakers, and, more particularly, to loudspeakers that can be mounted in ceilings and/or walls.

BACKGROUND

Ceiling and wall-mounted loudspeakers are often utilized in home entertainment systems. As most listening rooms present a more or less reflective environment due to walls, furniture, and other reflective surfaces, the sound that reaches a listener's ear consists not only of direct sound, but also consists of delayed sound that has been reflected off one or more boundaries. These reflected sound waves, when added to the direct sound of the loudspeaker, cause cancellation and/or addition of the sound waves at certain frequencies, which changes the character of the sound received by the listener. A significant factor in the resulting sound from a loudspeaker system is the amount of absorption and diffusion of the sound waves present in the environment. Optimally, a room containing an entertainment system should have a balance of diffusion and absorption of sound. Most entertainment systems will sound best when the loudspeakers are set up more or less symmetrically with respect to the listener and also to room boundaries. As early reflections have the most effect on the color of the sound (due to the Haas Effect), placing loudspeakers too close to either the rear or side walls is generally not preferred.

To avoid the reflective boundary concerns, loudspeakers are typically mounted within a ceiling or wall. For aesthetic purposes, these loudspeakers are generally mounted in locations that do not provide optimal acoustics. It has been long recognized that different loudspeaker placements require different technical performance from the loudspeakers. Currently available high quality loudspeakers have deficiencies when mounted on a different plane than the listener. For example, ceiling mounted loudspeakers commonly produce sound that appears to emanate from the ceiling. Direct sound radiation from the speakers and early reflections from nearby objects combine at the listener to reinforce the effect of the sound source being in the ceiling. This directional information, or "localization", is primarily determined by the ears from the high frequency (4 kHz-10 kHz range) content of the signal.

The human ear primarily uses three localization clues to determine the apparent position of a sound source—the interaural intensity difference (IID), the interaural time difference (ITD), and the spectral profile. The IID and ITD provide primary cues to horizontal position, but no cues to determine elevation. Because human ears are mounted in a manner that defines a horizontal plane, the IID and ITD are substantially unchanged for sound sources from a constant horizontal direction regardless of the elevation above the listening plane. The spectral profile is the dominant aural clue to the vertical localization of a sound source. In particular, the spectral profile in the 4 kHz-10 kHz range is the primary clue for elevation localization as disclosed by Tan, Jun, Liew and Gan in "Elevated Speakers Image Correction Using 3D Audio Processing", presented at the 109th AES Convention Sep. 22-25, 2000, the text of which is fully incorporated by reference herein.

Prior inventions have sought to improve the spatial imaging of elevated speakers through the use of complex three dimensional (3D) audio signal processing and electronic filtering. While this technique has some benefit, complex signal processing and electronic filtering is undesirable due to the additional circuitry required and associated additional costs. Prior inventions have also utilized scattering features to randomize the internal sound waves of a speaker, both to prevent the formation of standing waves and to diffuse the sound field in listening rooms. However, the use of these features has not been combined with controlled reflective surfaces applied to external speaker baffles to alter the spatial imaging of the speakers. Additionally, prior inventions have used directed speakers to produce a sound field oblique to an adjacent surface in order to reduce the projection of such speakers out past the surface into the living space. However, in these prior inventions, no attention has been paid to improving the spectral profile in order to alter the spatial imaging of the sound field produced by such speakers. Rather, these speakers have the spectral profile of the location where they are mounted, regardless of wall or ceiling mounting. Some of these inventions are discussed below.

U.S. Pat. No. 2,993,557 to Miller and McDonald discloses a stereo speaker system incorporating a sound reflecting surface having the shape of a curve that is symmetrical about the centerline between said loudspeakers in order to produce an omni-directional stereophonic effect. This patent does not involve a self contained, single channel loudspeaker to be used as one channel of a multi-channel system. Further, this patent does not address spatial imaging, specifically vertical spatial imaging, and is particularly only concerned with stereophonic effects in the listening plane.

U.S. Pat. No. 3,236,949 to Atal and Schroeder discloses the use of electronic signal processing using time delays, periodic repetitions of the signals, and electronic filters, so that "ordinary stereophonic signals may be given a wider stage width". While this patent is specifically concerned with giving ordinary stereophonic signals a wider stage width in the listening plane, it does not disclose means to reconstruct and launch the sound field from a speaker out of the listening plane towards the listener with a spectral profile that is substantially indistinguishable from that of a speaker mounted in the optimum position in the listener's plane.

U.S. Pat. No. 4,836,329 to Klayman discloses the use of a combination concave and convex semi-conical reflector to disperse the sound field of a vertically oriented loudspeaker over a wide horizontal area. While Klayman's device reflects most of the sound field with reflector surfaces that block direct sound radiation from the transducer, it does not disclose the use of an obliquely mounted electro-acoustic transducer to launch a sound field in a specific direction towards a listener with most of the direct sound radiation from the speakers going to the listener without reflection. Further, Klayman does not use controlled diffraction and reflection to modify the spectral response over the 4 kHz to 10 kHz frequency range, and hence improve spatial imaging, but rather discloses a wide-field dispersal of sound without regard to spatial imaging.

U.S. Pat. No. 5,333,202 to Okaya discloses the use of a sympathetically vibratable membrane to acoustically combine the sound field from two or more transducers. Okaya states that the device provides the acoustic equivalent of an optical hologram, providing a resultant sound field that "accurately preserves the relative position of each sound source in the aural image". However, Okaya's device deals entirely with right-left (lateral) localization, and does not involve the effects of spectral profile on the aural localization normal to the listening plane.

U.S. Pat. No. 5,764,782 to Hayes discloses a diffuse acoustic reflector characterized by a plurality of wells, where the depth of each well is governed by a quadratic residue sequence. The Hayes device provides a resultant sound field with constant directivity over frequency, which corrects for variations of directivity with frequency in the source transducer. For the Hayes device, it is particularly important that no stray paths exist for sound radiation directly from the speaker driver into the listening environment, but that only the reflected resultant sound field enter the listening environment. Hayes however, does not provide a loudspeaker with structure that allows the oblique sound field to be diffracted to create an acoustic shadow that precludes ceiling reflections and allows more of the direct radiation from the loudspeaker to reach the listener. Further, Hayes does not provide acoustic correction of the spectral profile to improve spatial imaging.

U.S. Pat. No. 5,784,468 to Klayman uses signal processing to derive sum and difference components from a stereo signal. Klayman also discloses sending the original signal, the sum, and the difference, to groups of transducers arranged in cabinets where the various signals recombine acoustically. Klayman's device serves to provide a wider lateral soundstage using only a two channel stereo source. Klayman's device does not include transducers that produce a sound field oblique to an adjacent surface, nor does it disclose modification of the spectral profile to provide localization cues.

U.S. Pat. No. 5,832,099 to Weiner discloses the use of a speaker having an undulating rigid speaker enclosure. Weiner specifically states that "the undulating wall of the speaker system randomizes the internal sound waves, thereby preventing the formation of standing waves." Also, Weiner discloses that "only the interior wall surface need undulate to cancel the standing waves and distortion, and that the exterior wall surface can be smooth." Weiner does not disclose a speaker containing an acoustic feature that is specifically placed on the external surface of the front baffle to alter the spatial imaging of the radiated dynamic sound field. Additionally, Weiner does not disclose an acoustic surface treatment molded into or applied to the front baffle which is substantially flat prior to application of the acoustic surface treatment.

U.S. Pat. No. 5,870,484 to Greenberger discloses the use of a combination of a centrally located loudspeaker array with signal processing to generate a signal dependent acoustic radiation pattern. Greenberger specifically manipulates the magnitude and phase of the frequency response from 150 Hz-1500 Hz, the range where the Interaural Time Differences (ITD) dominate, in order to control and expand the lateral localization of the signal source. However, Greenberger does not discuss the spectral profile as the dominant aural cue to the vertical localization of a sound source. Greenberger also does not disclose a spectral profile in the 4 kHz-10 kHz range and does not disclose manipulation of the aural cues for elevation localization.

U.S. Pat. No. 6,031,920 to Wiener discloses the use of parabolic-curved reflective and baffle structures to focus a sound field from vertical axis coaxial speakers. In this patent, the majority of the sound radiation is reflected by the parabolic baffles. Weiner does not disclose speakers with a radiated sound field having an axis which is oblique to the vertical. Further, Wiener does not utilize controlled reflection, diffraction, and absorption in a novel arrangement to improve the spectral profile, and thus improve spatial imaging.

U.S. Pat. No. 6,069,962 to Miller uses electronics and orthogonally mounted speakers to produce stereo from a single "point source". Miller relies on electronics to produce this result, rather than relying on acoustic design. Further, Miller does not disclose speakers that are mounted to launch a single channel sound field towards the listener such that although the speaker is mounted out of the listening plane, the listener perceives the sound source to be in the listening plane.

U.S. Pat. No. 6,134,332 to Wiener is similar to U.S. Pat. No. 6,031,920, but also discloses the use of cone and curved reflective and baffle structures to focus a sound field from oblique axis speakers. Weiner discloses placing the concave reflectors to intercept all of the direct radiation from the drivers so that all of the loudspeaker radiation is "reflected by the sound lens into a downward substantially focused beam". Weiner does not disclose however, the use of a substantially oblique axis direct sound field with the spectral profile modified by a complex curved baffle to manipulate the aural elevation cues to move the perceived sound field to the listening plane. Further, Weiner does not disclose the use of controlled reflection, diffraction, and absorption in a novel arrangement to improve the spectral profile, and thus improve spatial imaging.

U.S. Pat. No. 6,257,365 to Hulsebus discloses the use of cone-shaped reflective and baffle structures to redirect a 360 degree horizontal sound field from vertical axis speakers. Hulsebus does not provide for direct oblique axis sound radiation from the loudspeaker and does not disclose corrections to the spectral profile to improve spatial imaging.

U.S. Pat. No. 6,516,072 to Vinogradov discloses using a series of inverted and non-inverted cone reflective and baffle structures to redirect a horizontal sound field from vertical axis midrange speakers. As with U.S. Pat. No. 6,257,365 to Hulsebus, the primary objective is to produce a horizontal sound field from vertical axis (normal to the listening plane) drivers. Vinogradov does not provide for direct oblique axis sound radiation from the loudspeaker. Vinogradov further does not disclose corrections to the spectral profile to improve spatial imaging. Rather, Vinogradov discloses that the speakers are mounted with the aperture for the reflected sound field is in or close to the listening plane. However, Vinogradov does not disclose that the speakers can be mounted outside the listening plane while projecting a perceived sound field that appears to be in the listening plane.

U.S. Pat. No. 6,766,027 to Ryan discloses an elliptical ceiling speaker with opposing angled and moveable drivers. While Ryan discloses that there are benefits to pointing the speakers in the direction of the listening area with the speaker axis oblique to the mounting surface, there is no attempt to modify to the spectral profile to improve spatial imaging. The emphasis of the Ryan patent is to allow one or more of the transducers to move and be "aimed" at the listener, while the current invention involves that the geometry defined by the transducers and the specifically curved baffle be fixed in order to modify to the spectral profile to improve spatial imaging. The Ryan patent uses no rear enclosure to control the bass frequencies, whereas the rear enclosure is part of the current invention. Further, the Ryan patent discloses to point one of the drivers away from the listening area. In the current invention, the tweeter and mid-bass drivers are pointed directly at the listening area and the only drivers that are not aimed towards the listening area the passive radiators which produce very low frequencies that are substantially non-directional.

U.S. Pat. No. 6,772,859 to D'Antonio uses a series of "tiles" arranged to produce aperiodic acoustic diffusive surfaces. D'Antonio does not disclose a plurality of grooves on the baffle is arranged so that the oblique sound field will be diffracted creating an acoustic shadow that precludes ceiling reflections and allowing more of the direct radiation from the loudspeaker to reach the listener. D'Antonio also does not disclose acoustic correction of the spectral profile.

U.S. Pat. No. 6,830,275 and U.S. Pat. No. 6,926,116 to Shea disclose an angled enclosure in the ceiling/roof of a RV so that the occupants may enjoy a sound system without hitting their heads on the speakers. While these patents disclose mounting the drivers with the axis oblique to the mounting surface and pointing towards the listening area, Shea does not disclose specially curved reflecting, absorbing and diffusing surfaces to modify the spectral profile and improve spatial imaging. Shea is primarily concerned with physically mounting the devices in the limited space provided by an RV and allows a substantial part of the transducers to lie outside of the mounting plane. Shea further does not disclose placing all of the transducers behind/above the mounting plane.

U.S. Pat. No. 6,738,483 to Betts discloses the use of a device used in conjunction with and mounted in front of a driver "in a way which effects the critical acoustical loading and atmospheric coupling thereof, while controlling and shaping the ultimate acoustic waveform so that a hemispherical polar coverage pattern results." Betts also discloses that the unique aspect of the invention is "to distribute the acoustical energy of the driver assembly so as to provide an acoustical energy field of a true hemispherical pattern." A hemispherical pattern only serves to reinforce the listener's localization of the speaker in the ceiling. Thus, Betts does not disclose a device that launches the acoustic energy towards the listener in such a way that the resulting sound field is substantially indistinguishable from that of a speaker mounted in the listening plane.

U.S. Pat. No. 6,996,243 to Welker uses an inverted cone reflector above a vertical axis driver to produce a 360 degree sound field to increase the ratio of reflected to direct sound in the sound field and increase the size of the apparent sound field in the listening plane. This patent discloses the use of vertical axis drivers, rather than transducers mounted with the axis that are oblique to the mounting surface and pointed towards the listening area. Welker discloses the use of a large cone shaped reflector mounted in front of the transducer such that the reflector intercepts a substantial portion of the direct sound and reflects it in a substantially horizontal direction so to distribute the sound field a full 360 degrees about the transducer's vertical axis. Welker is not designed such that the spectral profile is modified to improve spatial imaging. Further, Welker is applicable to speakers mounted in the listening plane, rather than loudspeakers that can be mounted outside of the listening plane.

U.S. Pat. No. 7,054,451 to Janse discloses the use of electronics to suppress feedback and to "beam" the sound from several speakers in a particular direction in PA applications. While the device of the Janse patent serves to "beam" the sound field, reduce echoes, and filter the audio signal with electronic processing, Janse does not use a novel acoustic pattern to modify the spectral profile and thereby launch the acoustic energy towards the listener in such a way that the resulting sound field is substantially indistinguishable from that of a speaker mounted in the listening plane.

U.S. Pat. No. 7,092,541 to Eberbach discloses the use of speakers with cardioid patterns placed only forward of the listener to create "surround sound". This patent discloses the expansion of the apparent sound field in the listening plane. However, this patent does not discuss the use of controlled reflection, diffraction, and absorption to improve the spectral profile and thus improve the spatial imaging to launch the acoustic energy from a loudspeaker mounted outside the listening plane towards the listener in such a way that the resulting sound field is substantially indistinguishable from that of a speaker mounted in the listening plane.

Therefore, it would be advantageous to provide a self contained, single channel loudspeaker to be preferably used as one channel of a multi-channel loudspeaker system, that improves spatial imaging without the use of electronic signal processing, that applies to content in the 4 kHz to 10 kHz range, that uses an obliquely mounted electro-acoustic transducer to launch a sound field in a specific direction towards a listener with most of the direct sound radiation from the speakers traveling to the listener without reflection, that only uses controlled diffraction and reflection to modify the spectral response over the 4 kHz to 10 kHz frequency range, that causes the oblique sound field to be diffracted to create an acoustic shadow that precludes ceiling reflections and allows more of the direct radiation from the loudspeaker to reach the listener, and that reconstructs and launches the sound field that provides an aural image to the listener that is substantially indistinguishable from that of a speaker mounted in the optimum position in the listener's plane.

SUMMARY

The preferred embodiment of the present invention involves a loudspeaker system that can be mounted in a ceiling or wall. The loudspeaker system includes an enclosure having an open end and defining an interior region, a baffle coupled to the enclosure along a plane parallel with the open end, a high-frequency speaker operating in the 4 kHz to 10 kHz frequency range coupled to the baffle, and a device coupled to the baffle for altering sound waves to modify the spectral profile of the projected sound waves in the 4 kHz to 10 kHz frequency range. The baffle is at least partially disposed within the interior region through the open end. The baffle can include a first angled surface and a second angled surface adjoining the first angled surface. The baffle is preferably square-shaped, similar to the enclosure. The first angled surface and the second angled surface are each oriented at an oblique angle with respect to the plane, wherein the at least one high-frequency speaker is coupled to the first angled surface and the device for altering sound waves projected from the high-frequency speaker is coupled to the baffle at least partially along the intersection of the first angled surface and the second angled surface.

Sound waves projected from the high-frequency speaker are altered by the device for altering sound waves to modify the spectral profile of the projected sound waves in the 4 kHz to 10 kHz frequency range, such that, when the loudspeaker system is mounted in a wall or ceiling, the loudspeaker projects a sound field, including sound waves in the 4 kHz to 10 kHz frequency range, that is substantially indistinguishable from the sound field of a loudspeaker located within the same listening plane as a listener. The device for altering sound waves projected from the at least one high-frequency speaker can be coupled to the baffle in the path of sound waves projected from the at least one high-frequency speaker, and can comprise a three-dimensional ribbed portion. The three-dimensional ribbed portion is defined by a plurality of ribs each having a peak region, the plurality of peak regions aligned to project a substantially concave arc along the ribbed region away from the at least one high-frequency speaker, and each having a substantially convex profile perpendicular to the path of sound waves projected from the high-frequency speaker. The ribbed portion can also include a plurality of substantially convex grooves located between the ribs and each oriented substantially perpendicular to the path of sound waves projected from the at least one high-frequency speaker. The width of each of the plurality of substantially convex grooves is within the range of distances determined by one-fourth of the wavelength of sound energy in the 4 kHz to 10 kHz frequency range. The depth of each of the plurality of substantially convex grooves is within the range of distances determined by one-eighth of the wavelength of sound energy in the 4 kHz to 10 kHz frequency range. The spacing between each of the plurality of substantially convex grooves is within the range of distances determined by one-fourth of the wavelength of sound energy in the 4 kHz to 10 kHz frequency range. The ribbed portion can project above the surface of the baffle to a height within the range of distances determined by one-half of the wavelength of sound energy in the 4 kHz to 10 kHz range.

The first side and the second side of the baffle can each also have a plurality of grooves formed therein to prevent direct reflections of sound energy in the 4 kHz to 10 kHz range. The plurality of grooves can be oriented substantially parallel to the first angled surface and can provide an acoustic impedance termination to substantially match sound energy in the 4 kHz to 10 kHz frequency range. In another embodiment, the first side and the second side of the enclosure can each have a portion of acoustic damping material coupled thereto. Each portion of acoustic damping material can have a plurality of grooves formed therein to prevent direct reflections of sound energy in the 4 kHz to 10 kHz range. The plurality of grooves can be oriented substantially parallel to the first angled surface and can provide an acoustic impedance termination to substantially match sound energy in the 4 kHz to 10 kHz frequency range.

In still another embodiment, the device for altering sound waves projected from the high-frequency speaker comprises a three-dimensional ribbed portion defined by a plurality of curves each having a peak region, the plurality of peak regions aligned to project a substantially convex arc along the ribbed region away from the at least one high-frequency speaker, and each having a substantially concave profile perpendicular to the path of sound waves projected from the at least one high-frequency speaker.

In yet another embodiment, the loudspeaker system can include at least one low-frequency speaker coupled to the baffle in proximity to the at least one high-frequency speaker, the at least one low-frequency speaker substantially operating at a frequency less than 100 Hz. The loudspeaker system can further include at least one mid-range frequency speaker coupled to the baffle in proximity to the at least one high-frequency speaker, the at least one mid-range frequency speaker substantially operating at a frequency range between about 100 Hz and 4 kHz.

In another embodiment, the first side and the second side each have a plurality of grooves formed therein to prevent direct reflections of sound energy in the 4 kHz to 10 kHz range, the plurality of grooves each oriented substantially parallel to the first angled surface and providing an acoustic impedance termination to substantially match sound energy in the 4 kHz to 10 kHz frequency range. The first side and the second side can each have a portion of acoustic damping material coupled thereto and each having a plurality of grooves formed therein to prevent direct reflections of sound energy in the 4 kHz to 10 kHz range. The plurality of grooves can be oriented substantially parallel to the first angled surface and can provide an acoustic impedance termination to substantially match sound energy in the 4 kHz to 10 kHz frequency range.

In a further embodiment, the loudspeaker can also include a curved region formed on the portion of the first angled surface adjacent to the at least one high-frequency speaker and opposite the means for altering sound waves projected from the at least one high-frequency speaker. The curved can have a substantially convex shape perpendicular to the first angled surface and a substantially concave profile parallel to the first angled surface. The curved region can serve to prevent unwanted diffraction and forward projection of rearward sound energy from the high-frequency speaker from coloring the spectral profile in the 4 kHz to 10 kHz range.

These and other features and aspects of the embodiments of the invention will be better understood with reference to the following description, drawings, and appended claims.

DETAILED DESCRIPTION OF THE EMBODIMENTS OF THE INVENTION

Figure 1:
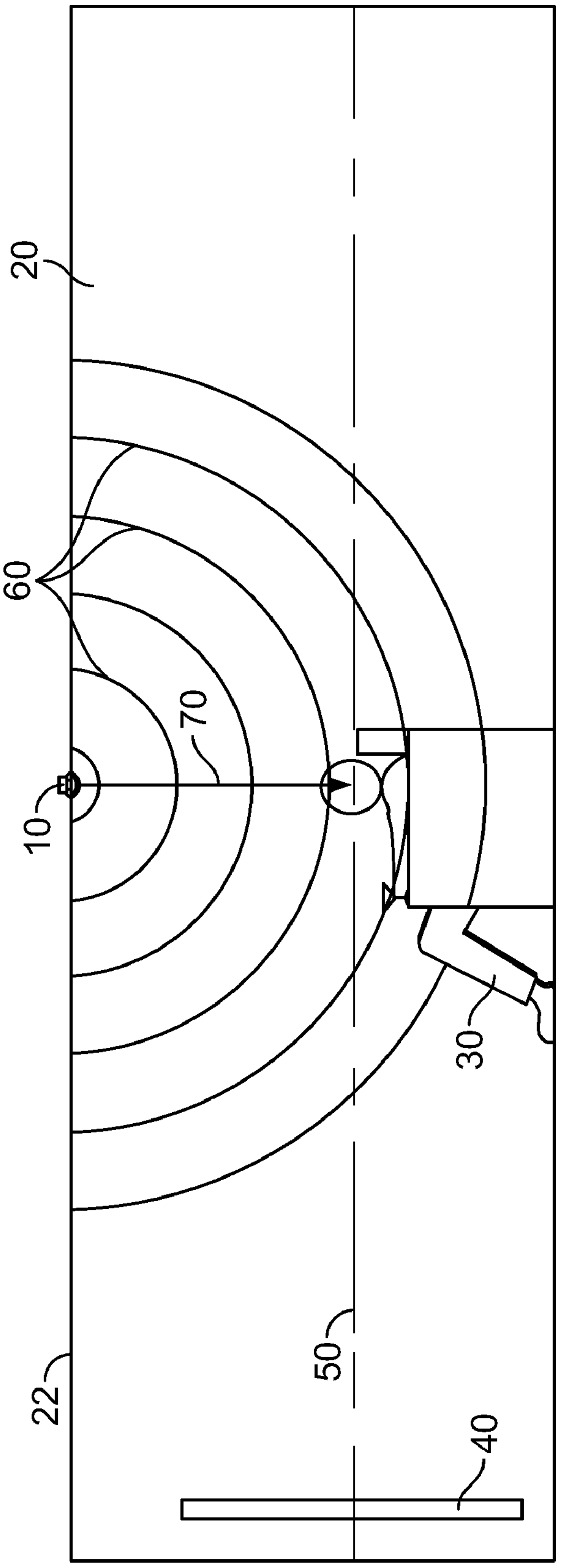
FIG. 1 (Prior Art)
FIG. 1 shows a side view of a prior art loudspeaker mounted within the ceiling of a room and outside of the listening plane of the viewer.

Reference will now be made in detail to several embodiments of the invention that are illustrated in the accompanying drawings. Wherever possible, same or similar reference numerals are used in the drawings and the description to refer to the same or like parts. The drawings are in a simplified form and are not to precise scale. For purposes of convenience and clarity only, directional terms, such as, top, bottom, left, right, up, down, over, above, below, beneath, rear, and front, may be used with respect to the accompanying drawings. These and similar directional terms should not be construed to limit the scope of the invention in any manner. Furthermore, in descriptions and in claims, "couple," "connect," and similar words with their inflectional morphemes do not necessarily import an immediate or direct connection, but include connections through mediate elements within their meanings.

Referring more particularly to the drawings, FIG. 1 shows a side view of a prior art loudspeaker 10 mounted within the ceiling 22 of a room 20 containing a listener 30. Listener 30 is positioned in room 20 in front of an image source 40, with the image projected along a plane 50. Loudspeaker 10 projects a sound field 60 in a direction 70 towards a listener 30. Listener 30 perceives sound field 60 to be emanating from loudspeaker 10 positioned overhead, as determined by the head related transfer function and elevation clues. The perception that sound field 60 is coming from overhead conflicts with the listener's perception of the visual material from image source 40, which requires sound field 60 to be focused along plane 50. The conflict in location of the image source and the location of the sound source prevents listener 30 from realizing the full effect of the home theatre experience.

Figure 2:
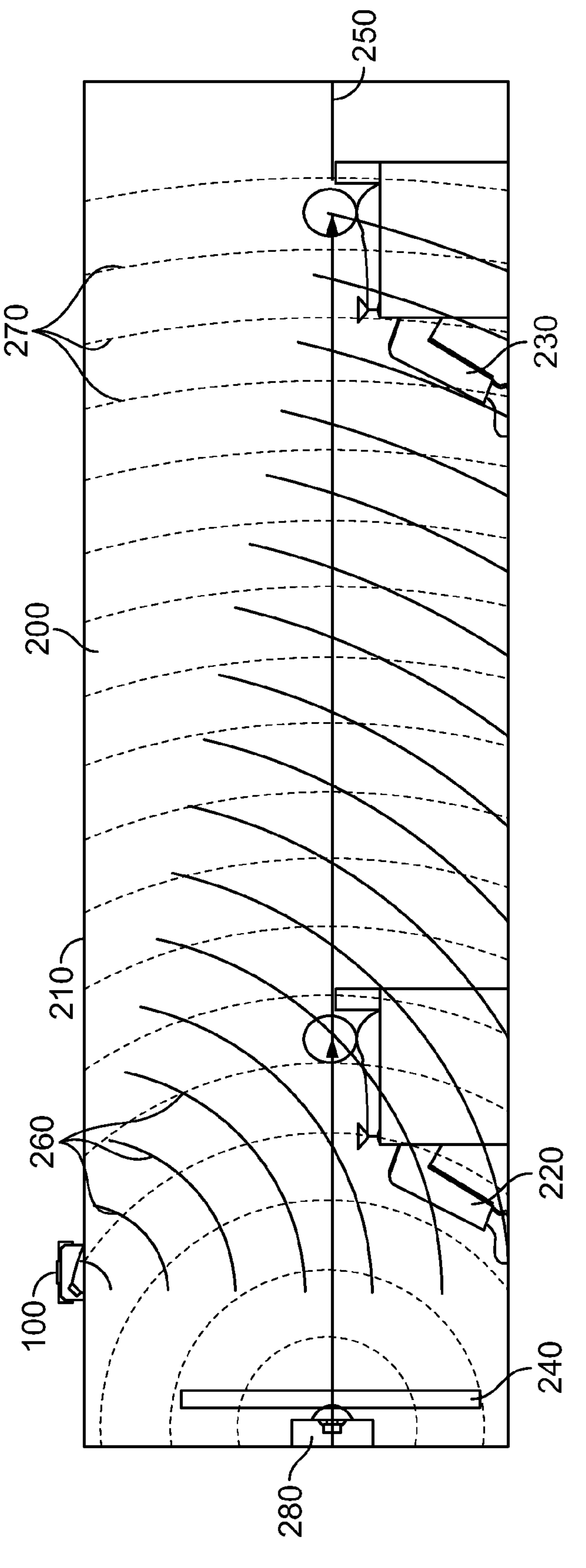
FIG. 2 shows a side view of the preferred embodiment of the ceiling or wall mounted speaker system with anti-diffraction wave launching device, mounted within the ceiling of a room and outside of the listening plane of the viewer.

FIG. 2 shows the preferred positioning of the loudspeaker system with anti-diffraction wave launch device 100 within a ceiling 210 of a room 200 containing listeners 220 and 230. Loudspeaker system 100 is preferably positioned within ceiling 210 between an image source 240 and listener 220. The location of image source 240 and listeners 220 and 230 create a plane 250. Loudspeaker system 100 has an improved spectral profile that modifies the spatial image, thus causing a sound field 260 to be launched towards listeners 220 and 230 such that listeners 220 and 230 perceive a virtual sound field 270. Virtual sound field 270 is perceived to be emanating from a virtual source 280 located within plane 250, which is coincidental with image source 240. The perceived matching of the virtual sound field 270 with plane 250 help create a realistic home theatre experience for both listeners 220 and 230.

Figure 3:
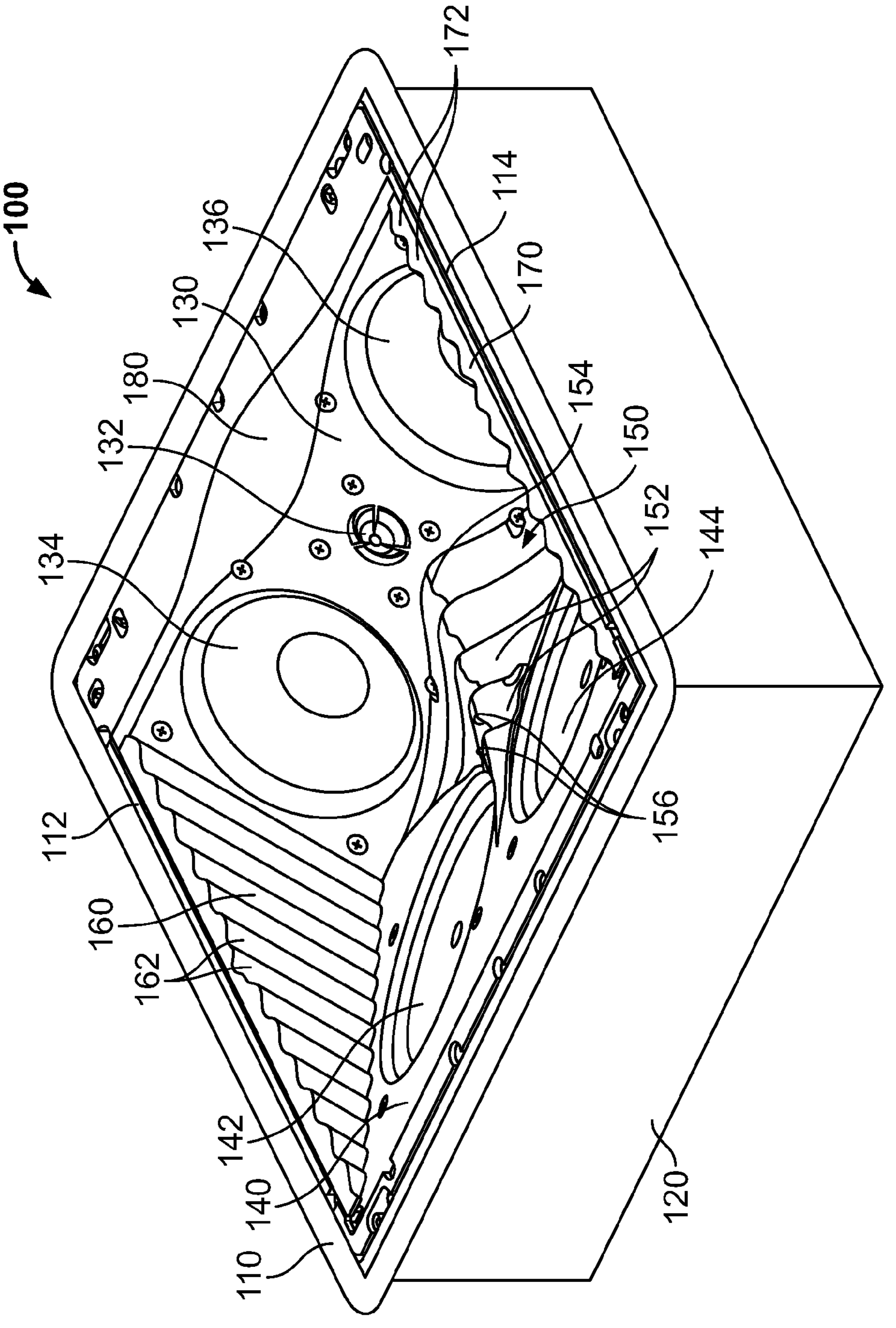
FIG. 3 shows a front perspective view of the ceiling or wall mounted speaker system with anti-diffraction wave launching device, not mounted to a wall or ceiling.

FIG. 3 shows the preferred embodiment of loudspeaker system 100. Loudspeaker system 100 includes a baffle 110 connected to an enclosure 120. Enclosure 120 defines an interior region (not shown) and has an open end (not shown) through which baffle 110 is at least partially disposed therethrough. Enclosure 120 and baffle 110 are preferably substantially square-shaped, but can comprise other shapes such as rectangular, trapezoidal, circular, or other shapes as would be recognized in the art. Enclosure 120 can include features, and example of which can be seen in FIG. 6, on the outer region thereof for mounting loudspeaker system 100 to a wall or ceiling, as would be recognized by one with ordinary skill in the art. Baffle 110 includes a first angled surface 130 and a second angled surface 140 adjoining first angled surface 130. First angled surface 130 and second angled surface 140 are each oriented at an oblique angle with respect to the plane formed along and parallel to the open end of enclosure 120. Baffle 110 is preferably one continuous molded piece, such that first angled surface 130 and second angled surface 140 are permanently joined together. However, baffle 110 can comprise several parts, such that first angled surface 130 and second angled surface 140 can be separately joined and adjusted to provide varying sound characteristics. Baffle 110 has an interior region defined by first angled surface 130, second angled surface 140, a first side 112, and a second side 114. A high-frequency speaker 132 (typically referred to as a "tweeter") is coupled to first angled surface 130. High-frequency speaker 132 preferably operates in the 4 kHz to 10 kHz frequency range. The output of high-frequency speaker 132 is projected at an angle that is oblique with respect to the plane formed along and parallel to the open end of enclosure 120. More than one high frequency speaker 132 can be located within baffle 110. For example, loudspeaker system 100 can include two or three high frequency speakers 132.

A means for altering sound waves projected from high-frequency speaker 132 is coupled to baffle 110, preferably in the path of sound waves projected from high-frequency speaker 132. The means is preferably coupled to the baffle at least partially along the intersection of first angled surface 130 and second angled surface 140. However, the means can also be coupled only to first angled surface 130, only to second angled surface 140, or on the side portions of baffle 110. The means can include a combination of controlled reflective, dispersive, absorptive, and diffractive features to provide wave-shaping that modifies the spectral profile of the sound field projected from high frequency speaker 132 and to launch the sound field towards the listener when loudspeaker system 100 is mounted within a ceiling. The means is carefully chosen in order to improve the spectral profile in the 4 kHz to 10 kHz frequency range, which is primarily responsible for the elevation localization clues. The means preferably comprises a three-dimensional ribbed portion 150 defined by a plurality of ribs 152. Ribs 152 each have a peak region 154, the plurality of peak regions 154 aligned to project a substantially concave arc along ribbed portion 150 away from high-frequency speaker 132. Ribs 152 also each have a substantially convex profile perpendicular to the path of sound waves projected from the high-frequency speaker 132. Another embodiment of ribbed portion 150 can include a plurality of ribs each having a peak region. The plurality of peak regions are aligned to project a substantially convex arc along ribbed portion 150 away from high-frequency speaker 132. The plurality of ribs each have a substantially concave profile perpendicular to the path of sound waves projected from high-frequency speaker 132. In either embodiment, ribbed portion 150 can be coupled to, or molded within, baffle 110.

Ribbed portion 150 also includes a plurality of substantially convex grooves 156 each oriented substantially perpendicular to the path of sound waves projected from high-frequency speaker 132. Grooves 156 are located between ribs 152. The dimensions of grooves 156 are chosen to maximize the benefit of smoothing the spectral profile and are substantial fractions of the wavelength of sound in the 4 kHz to 10 kHz frequency range. The width of each of grooves 156 is preferably within the range of distances determined by one-fourth of the wavelength of sound energy in the 4 kHz to 10 kHz frequency range. The depth of each of grooves 156 is preferably within the range of distances determined by one-eighth of the wavelength of sound energy in the 4 kHz to 10 kHz frequency range. The spacing of each of grooves 156 is preferably within the range of distances determined by one-fourth of the wavelength of sound energy in the 4 kHz to 10 kHz frequency range. The number of ribs 152 and grooves 156 can vary depending on the size, spacing, and dimensioning of loudspeaker system 100 and ribbed portion 150. Ribbed portion 150 can be oriented to project above the surface of baffle 110 to a height within the range of distances determined by one-half of the wavelength of sound energy in the 4 kHz to 10 kHz range.

The means for altering sound waves projected from the high-frequency speaker 132 can also comprise acoustic damping panels 160 and 170 connected to baffle 110. Panels 160 and 170 can also be attached directly to enclosure 120, provided baffle 110 does not contain first side 112 or second side 114. Panels 160 and 170 each have a plurality of grooves 162 and 172 formed therein to prevent unwanted baffle reflections and resonances to color the sound field in the 4 kHz to 10 kHz range. The plurality of grooves 162 and 172 are each oriented substantially parallel to first angled surface 130, but can also be oriented at different angles to vary the characteristics of the waves projected from high-frequency speaker 132. The plurality of grooves 162 and 172 preferably provide an acoustic impedance termination to substantially match sound energy in the 4 kHz to 10 kHz frequency range. However, if it is desired to provide an acoustic impedance termination to substantially match sound energy in lower frequency ranges, such as to match sound from mid-range frequency speakers 134 and 136 and/or low-range frequency speakers 142 and 144, plurality of grooves 162 and 172 can be accordingly altered in size, shape, and/or orientation. Panels 160 and 170 are preferably comprised of a foam material that can damp a substantial portion of the sound energy whenever the wavelength of the sound is less than approximately four times the thickness of the foam material. However, panels 160 and 170 can be comprised of other material that provides suitable damping of the desired sound energy. Panels 160 and 170 are preferably incorporated into loudspeaker system 100 along with ribbed portion 150.

In another embodiment, the means for altering sound waves projected from the high-frequency speaker 132 can also comprise a plurality of grooves (not shown) formed within first side 112 and second side 114 to prevent direct reflections of sound energy in the 4 kHz to 10 kHz range. The plurality of grooves can act as a diffraction grating for oblique reflections, which help to disperse the sound energy from high-frequency speaker 132. The plurality of grooves can each be oriented substantially parallel to first angled surface 130, and could be preferably molded directly into baffle 110. The plurality of grooves can also preferably provide an acoustic impedance termination to substantially match sound energy in the 4 kHz to 10 kHz frequency range. In another embodiment, the means for altering sound waves projected from the high-frequency speaker 132 can also comprise a plurality of grooves (not shown) formed directly within the side portions of enclosure 120 to prevent direct reflections of sound energy in the 4 kHz to 10 kHz range.

Loudspeaker system 100 can also include at least two mid-range frequency speakers 134 and 136 coupled to first angled surface 130 adjacent to high-frequency speaker 132. Mid-range frequency speakers 134 and 136 can each operate substantially at a frequency range between about 100 Hz and 4 kHz. In certain embodiments, loudspeaker system 100 can only include one mid-range frequency speaker. Loudspeaker system 100 can also include at least two low-range frequency speakers 142 and 144 coupled to second angled surface 140 adjacent to high-frequency speaker 132. Low-range frequency speakers 142 and 144 can each operate substantially at a frequency range below 100 Hz. In certain embodiments, loudspeaker system 100 can only include one low-range frequency speaker.

Loudspeaker system 100 can also include a curved baffle region 180 formed on the portion of first angled surface 130 adjacent to high-frequency speaker 132 and opposite ribbed portion 150. Curved baffle region 180 preferably has a substantially convex shape perpendicular to first angled surface 130 and a substantially concave profile parallel to first angled surface 130. Curved baffle region 180 is the conjugate of ribbed portion 150 in that it works on the rearward sound energy, and is opposite in shape. For example, whereas ribbed portion 150 is concave parallel to the axis of projection of high-frequency speaker 132, curved baffle region 180 is convex. Similarly, whereas ribbed portion 150 is convex perpendicular to the axis of projection of high-frequency speaker 132, curved baffle region 180 is concave. In embodiments where ribbed portion 150 is shaped differently, curved baffle region 180 will also be modified such that it is oppositely shaped with regard to ribbed portion 150. Curved baffle region 180 primarily serves to prevent unwanted diffraction and forward projection of rearward sound energy from the high-frequency speaker 132 from coloring the spectral profile in the 4 kHz to 10 kHz range.

Figure 4:
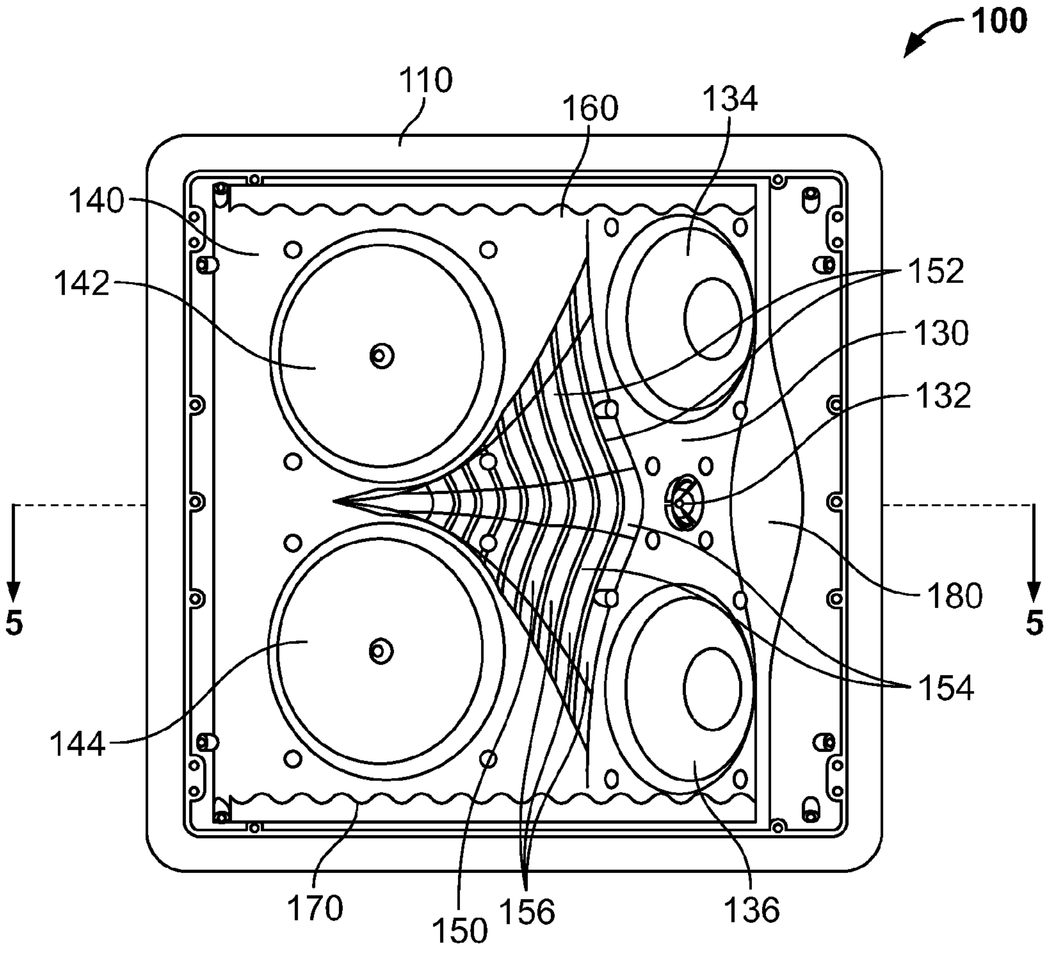
FIG. 4 shows a top view of the ceiling or wall mounted speaker system with anti-diffraction wave launching device.
Figure 5:
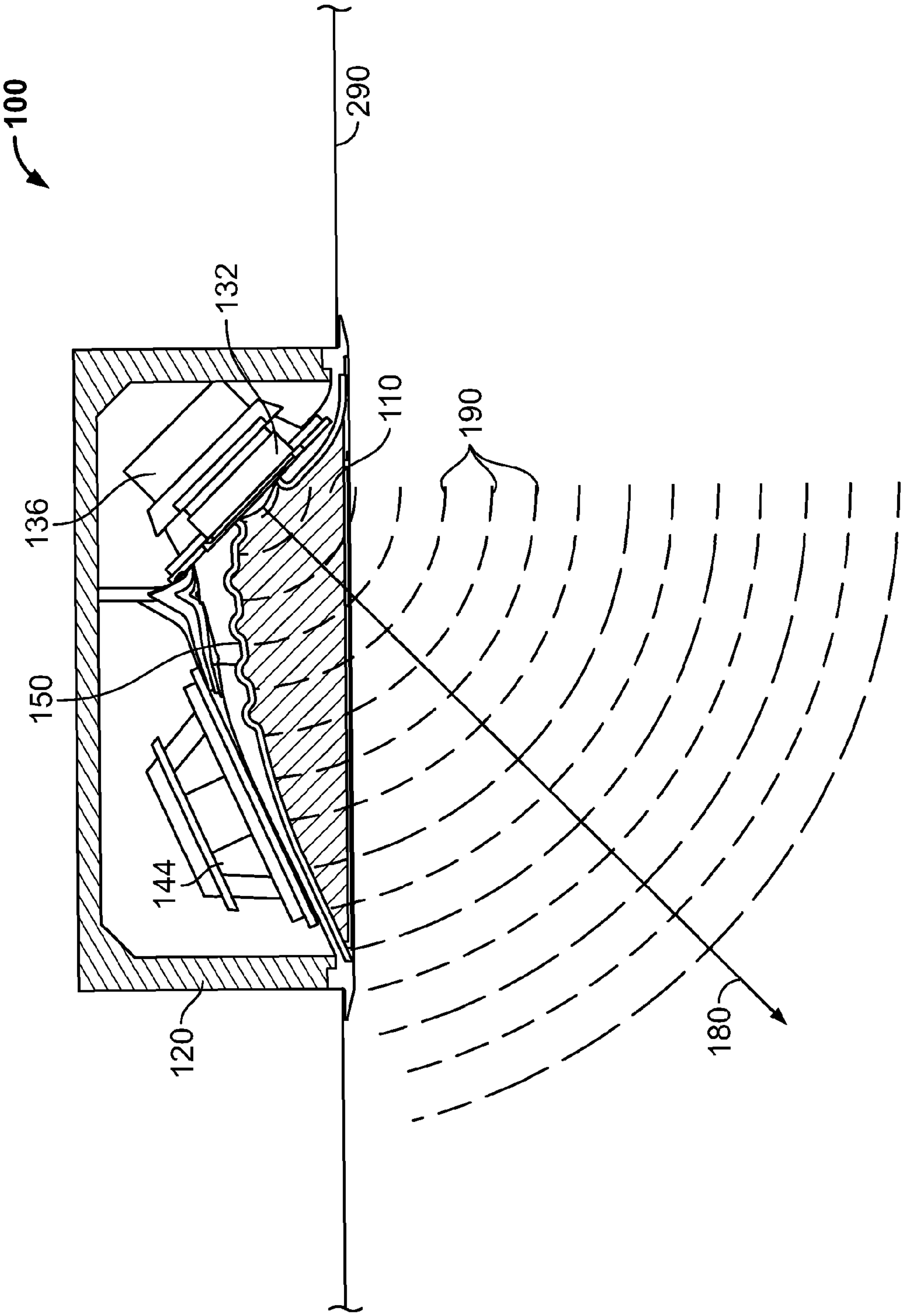
FIG. 5 shows a side cross-section view of the ceiling or wall mounted speaker system with anti-diffraction wave launching device, mounted in a ceiling.

Referring now to FIGS. 4 and 5, FIG. 4 shows a top view of loudspeaker system 100. This figure particularly shows the distribution of ribbed portion 150 on baffle 110, including ribs 152, peak regions 154, and grooves 156. FIG. 5 shows a cross-sectional view along the line A-A' in FIG. 4 of loudspeaker system 100 as mounted within a ceiling 290. This configuration can be similar to the configuration of loudspeaker system 100 as shown in FIG. 2. FIG. 5 particularly illustrates the angled direction 180 of the sound waves 190 projecting from loudspeaker system 100.

Figure 6:
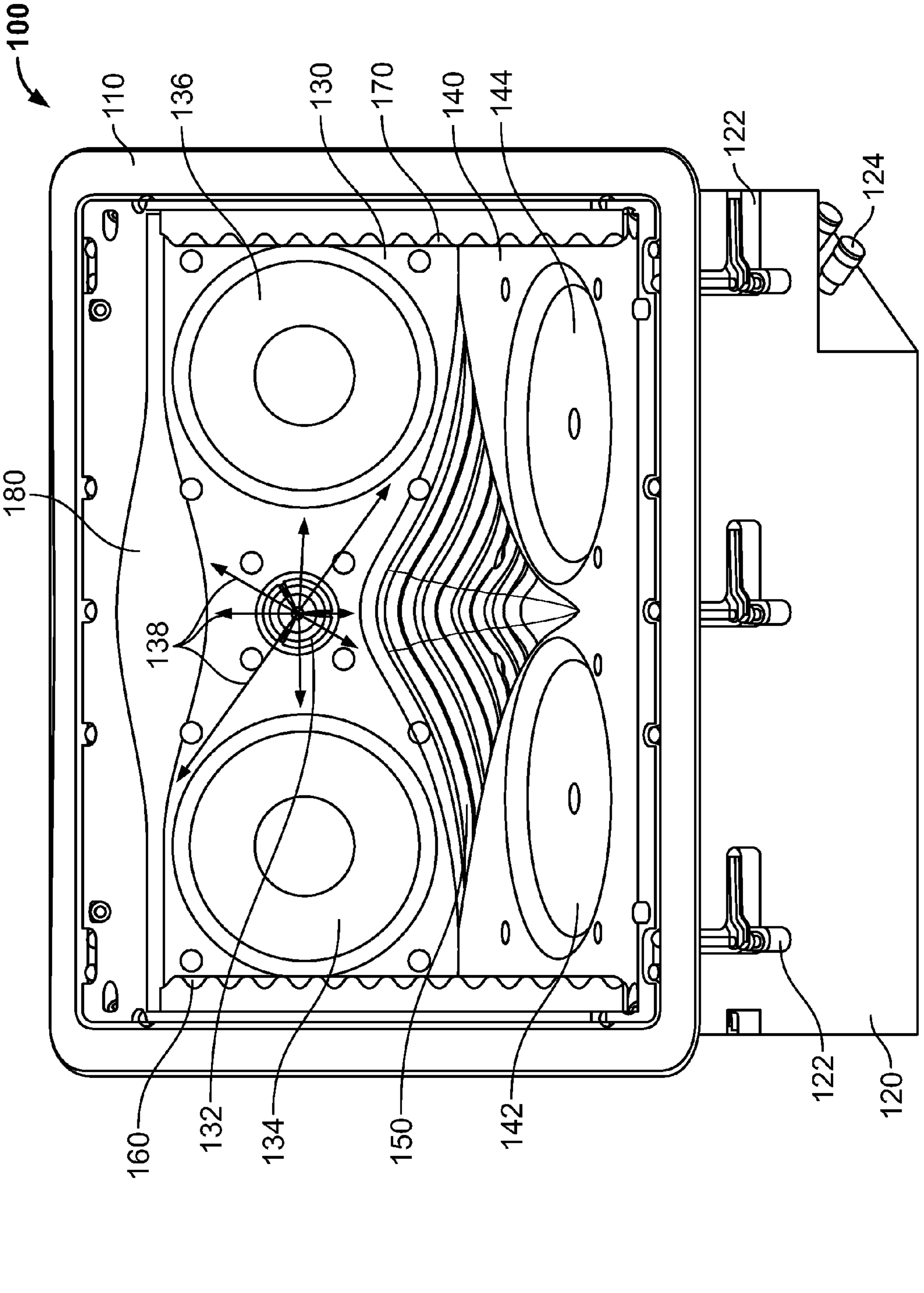
FIG. 6 shows a top perspective view of the loudspeaker system along the axis of the high-frequency speaker, illustrating the variation in path lengths of the sound projected from the high-frequency speaker due to a curved baffle region.

FIG. 6 shows a top perspective view of loudspeaker system 100 along the axis of high-frequency speaker 132. This figure illustrates the variation in path lengths 138 of the sound projected from high-frequency speaker 132 due to curved baffle region 180, with some path lengths 180 being longer than others depending on the direction. FIG. 6 also shows mounting brackets 122 attached to enclosure 120 that can be used to secure loudspeaker system 100 to a wall or ceiling, as well as input jack 124 for connecting loudspeaker system 100 to an electrical source. Although mounting brackets 122 help to mount loudspeaker system 100 within a ceiling or wall, loudspeaker system 100 can also be mounted within various vehicles, including but not limited to cars, trucks, vans, boats, motor homes, and buses. As such, various mounting features can be implemented in or on enclosure 120 to achieve such mounting, as would be recognized in the art.

Figure 7A:
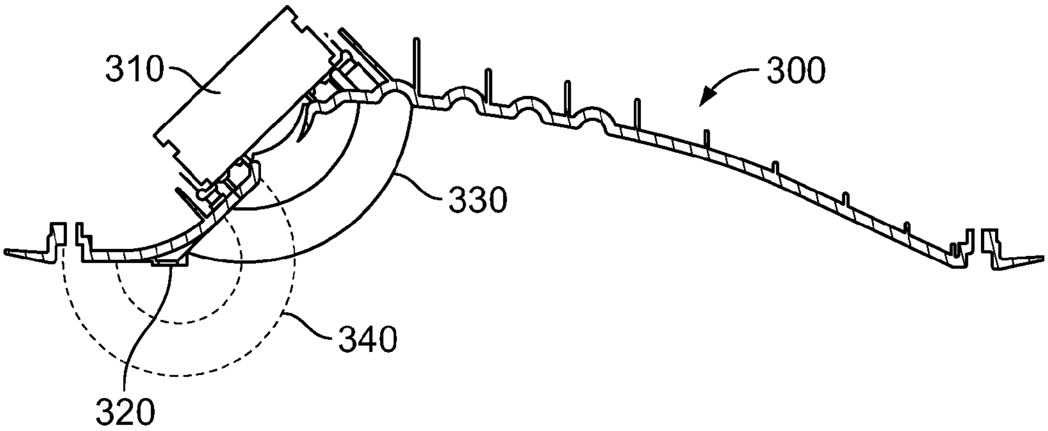
FIG. 7A shows a cross-section view of the baffle portion of a prior art loudspeaker system, illustrating the causation of unwanted diffraction due to a sharp region located within the baffle.

FIG. 7A shows a cross-section view of the baffle portion of a prior art loudspeaker 300 along the axis of projection of the high-frequency speaker 310. This figure shows the causation of unwanted diffraction in the 4 kHz to 10 kHz range due to the sharp region 320 located adjacent to the high-frequency speaker. When direct sound energy 330 reaches sharp region 320, there is a diffraction effect that re-radiates sound energy 340 in all directions, causing unwanted interference effects and coloration's of the spectral profile in the 4 kHz to 10 kHz frequency range.

Figure 7B:
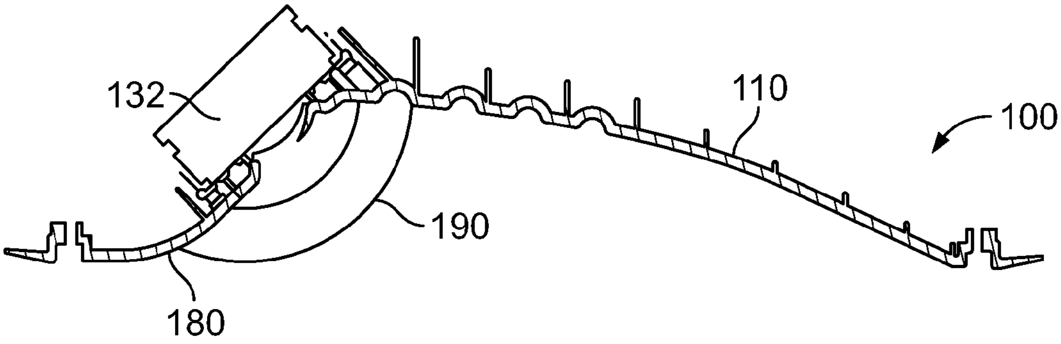
FIG. 7B shows a cross-section view of the baffle portion of the loudspeaker system, illustrating the elimination of unwanted diffraction due to a curved baffle region.

FIG. 7B shows a cross-section view of the baffle 110 of loudspeaker system 100 along the axis of projection of high-frequency speaker 132. This figure illustrates the elimination of unwanted diffraction in the 4 kHz to 10 kHz range due to the curved baffle region 180. By replacing the sharp region (as seen in FIG. 7A), with curved baffle region 180, the diffraction effect is substantially mitigated for all wavelengths of sound smaller than approximately four times the radius of curved baffle region 180. Curved baffle region 180 provides a constantly changing radius, to prevent uniform diffraction along the resulting cylindrical edge from a constant radius that would cause unwanted coloration. A constantly changing radius provides two key benefits—1) the smearing out of the anti-diffraction effect among a range of frequencies based on the local radius, and 2) causing path lengths 138 (see FIG. 6) from high-frequency speaker 132 to curved baffle region 180 to vary dramatically depending upon the angle of curved baffle region 180. Having a variable and non-symmetric path length to the nearest diffraction feature makes a dramatic improvement in smoothing the high frequency (4 kHz to 10 kHz) spectral profile of a speaker. As shown, sound energy 190 is able to radiate in all directions free from unwanted diffraction (as seen in FIG. 7A).

Figure 8:
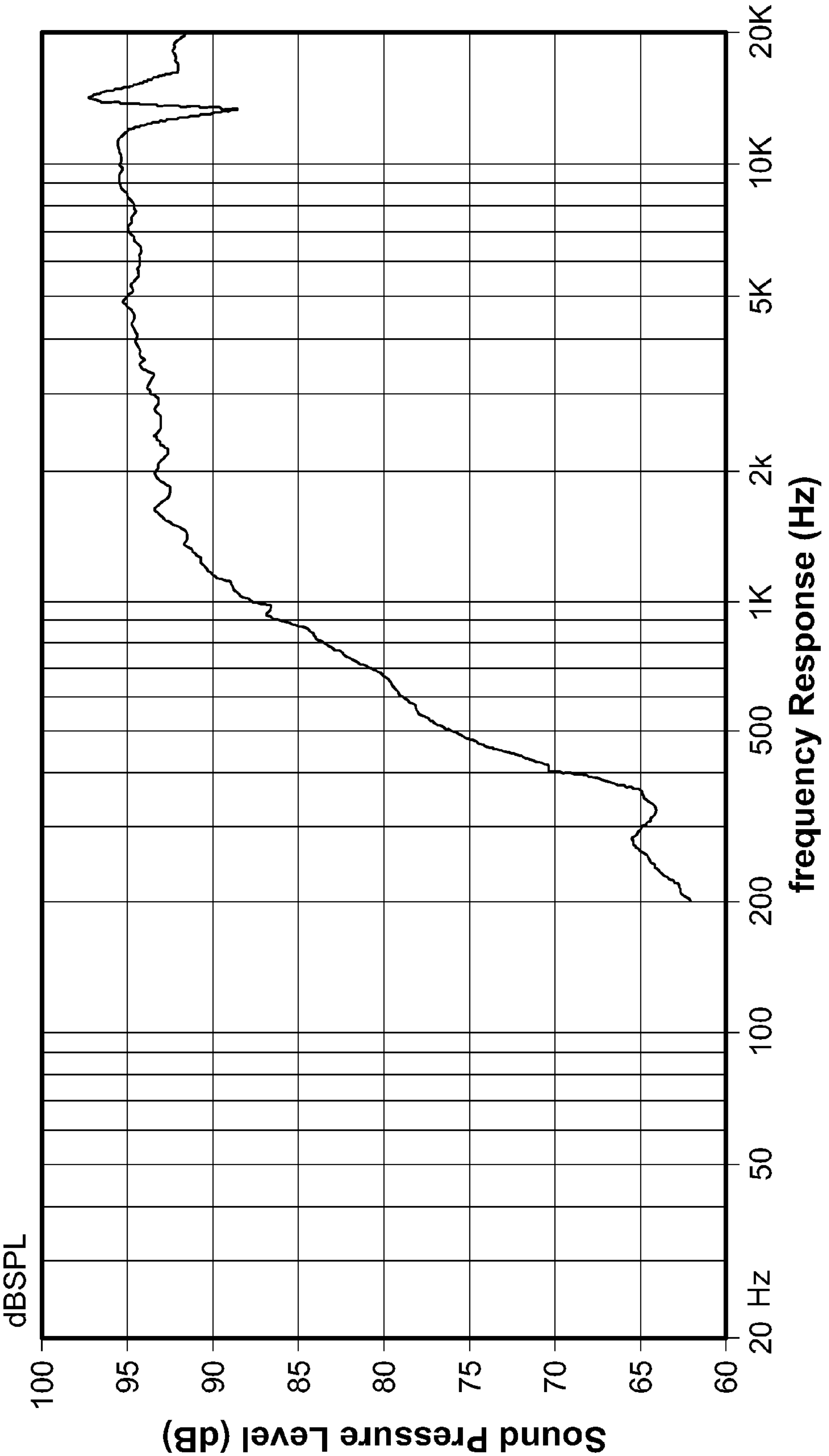
FIG. 8 shows a graph of a sound pressure level versus frequency curve of an ideal speaker situated within the listening plane of a listener.
Figure 9:
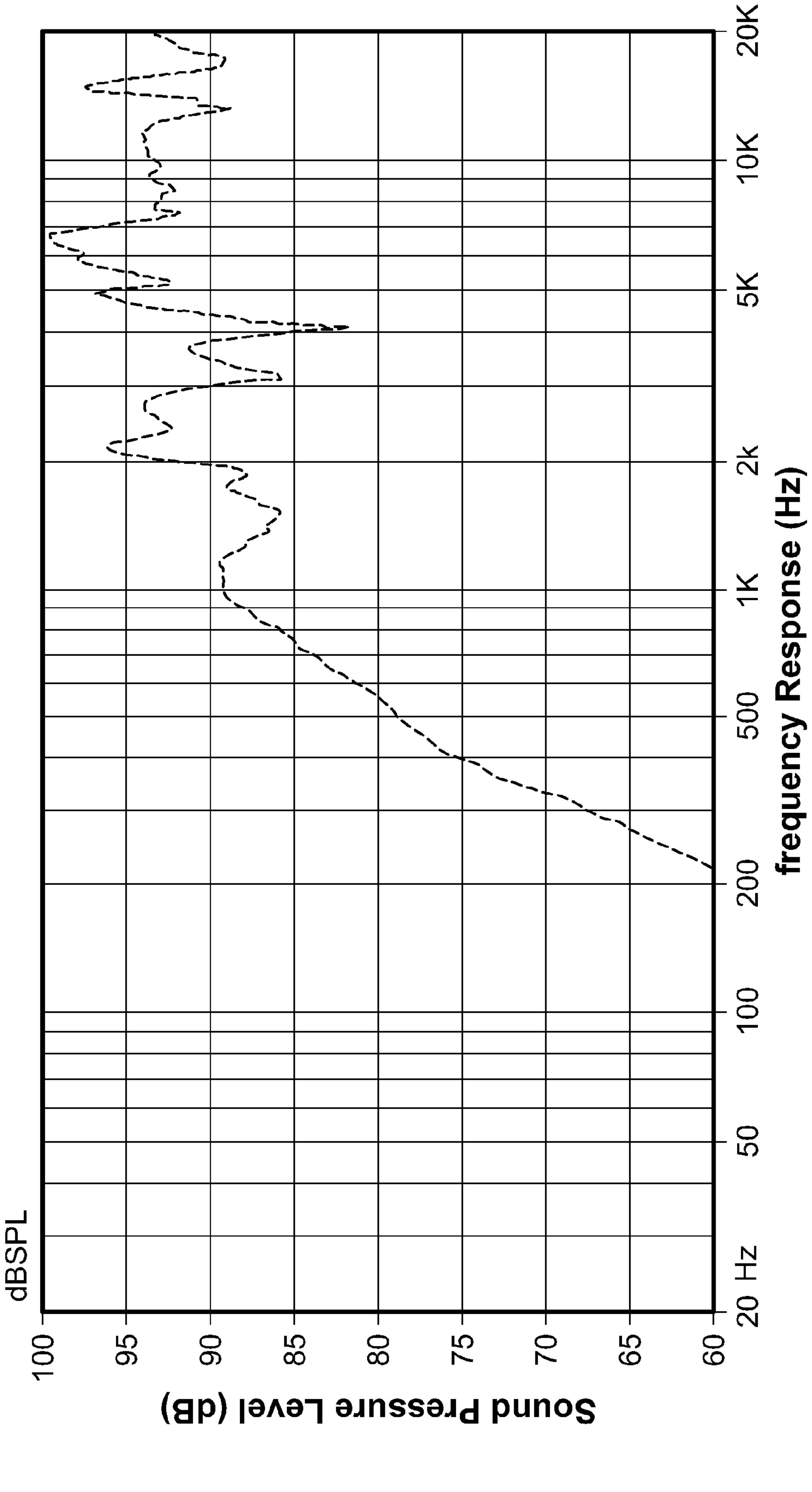
FIG. 9 shows a graph of a sound pressure level versus frequency curve of a prior art ceiling mounted speaker with no wave launch features.
Figure 10:
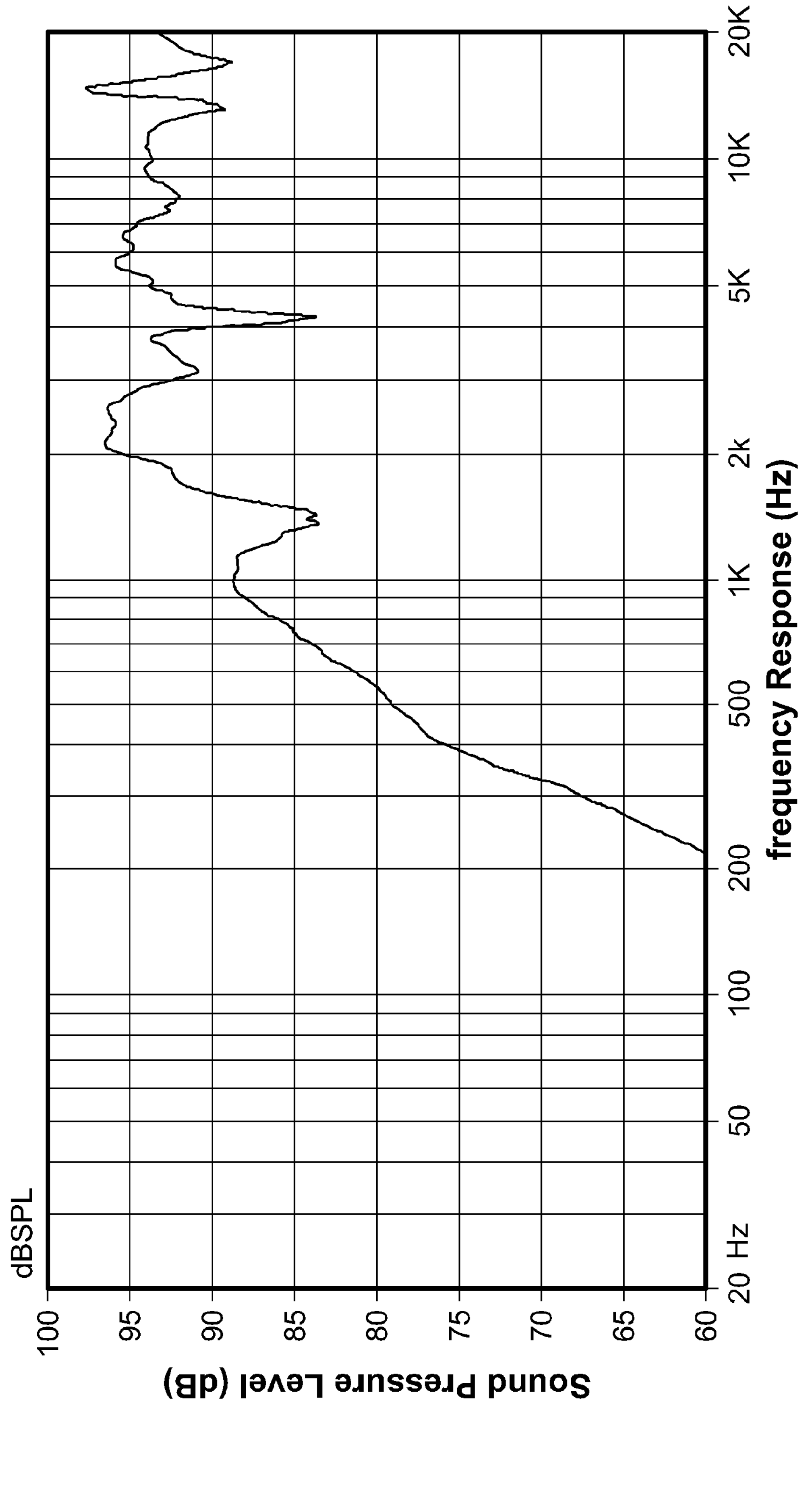
FIG. 10 shows a graph of a sound pressure level versus frequency curve of a speaker of the ceiling or wall mounted loud speaker system with anti-diffraction wave launching device, illustrating the improved spectral profile in the high-frequency range due to the wave launch features.

Referring now to FIGS. 8, 9, and 10, FIG. 8 shows a graph of sound pressure level (SPL) versus frequency for an ideal loudspeaker situated within the listening plane of a listener, such as a loudspeaker situated within an image source. FIG. 9 shows a graph of SPL versus frequency for a typical prior art loudspeaker mounted outside the listening plane of the listening, such as within a ceiling (similar to that as shown in FIG. 1). Only the high frequency loudspeaker SPL is displayed, and there is no special processing of the audio signal. The SPL curve indicates substantially the same peaks and valleys in the 4 kHz to 10 kHz range as disclosed by Tan, Jun, Liew and Gan in "Elevated Speakers Image Correction Using 3D. Audio Processing." As shown, the peak (max) to valley (min) height in the 4 kHz to 10 kHz range is 18 dB. FIG. 10 is a graph of SPL versus frequency for loudspeaker system 100 mounted in a similar fashion to the prior art speaker as tested in FIG. 9 (mounted within a ceiling). The SPL in the 4 kHz to 10 kHz range is significantly smoother than the prior art speaker of FIG. 9. The addition of the sound wave alteration means has caused the peak (max) to valley (min) height to be reduced to 12 dB, along with causing a 4 dB to 5 dB of smoothing in the 4 kHz to 10 kHz range. The SPL response shown in FIG. 10 is approaching the ideal shown in FIG. 8. The improvement in the spectral profile provided by loudspeaker system 100 and evident in the curve shown in FIG. 10 is sufficient to project to a listener a sound field that is substantially indistinguishable from that of a speaker mounted in the optimum position in the listener's plane.

This document describes the inventive devices for elevating the spectral profile of high-frequency loudspeakers operating in the 4 kHz to 10 kHz range, such that the loudspeaker projects a sound field, including sound waves in the 4 kHz to 10 kHz frequency range, that is substantially indistinguishable from the sound field of a loudspeaker located within the same listening plane as a listener. This disclosure is done for illustration purposes only. Neither the specific embodiments of the invention as a whole, nor those of its features limit the general principles underlying the invention. The invention is not limited to disclosed mounting orientations. Although the embodiments of the invention are preferably mounted within a ceiling or wall, the embodiments of the invention can also be mounted within various vehicles, including but not limited to cars, trucks, vans, boats, motor homes, and buses. The specific features described herein may be used in some embodiments, but not in others, without departure from the spirit and scope of the invention as set forth. Many additional modifications are intended in the foregoing disclosure, and it will be appreciated by those of ordinary skill in the art that in some instances some features of the invention will be employed in the absence of a corresponding use of other features. The illustrative examples therefore do not define the metes and bounds of the invention and the legal protection afforded the invention, which function is served by the claims and their equivalents.

We claim:

1. A loudspeaker system comprising:

a) an enclosure defining an interior region, the enclosure having an open end;

b) a baffle coupled to the enclosure along a plane parallel with the open end, the baffle disposed at least partially within the interior region through the open end;

wherein the enclosure and the baffle are substantially square-shaped, the baffle having an interior region defined by the first angled surface, the second angled surface, a first side, and a second side;

c) at least one high-frequency speaker coupled to the baffle, the at least one high-frequency speaker operating in the 4 kHz to 10 kHz frequency range and oriented at an oblique angle with respect to the plane; and d) means for altering sound waves projected from the at least one high-frequency speaker coupled to the baffle comprising a three-dimensional ribbed portion defined by a plurality of ribs each having a peak region, the plurality of peak regions aligned to project a substantially concave arc along the ribbed portion away from the at least one high-frequency speaker, the plurality of ribs each having a substantially convex profile perpendicular to the path of sound waves projected from the at least one high-frequency speaker whereby sound waves projected from the at least one high-frequency speaker are altered by reflective, dispersive, absorptive or diffractive qualities of the three-dimensional ribbed portion to modify the spectral profile of the projected sound waves in the 4 kHz to 10 kHz frequency range, such that, when the loudspeaker system is mounted in a wall or ceiling, the loudspeaker projects a sound field, including sound waves in the 4 kHz to 10 kHz frequency range, that is substantially indistinguishable from the sound field of a loudspeaker located within the same listening plane as a listener.

2. The loudspeaker system of claim 1, wherein the three-dimensional ribbed portion for altering sound waves projected from the at least one high-frequency speaker is coupled to the baffle in the path of sound waves projected from the at least one high-frequency speaker.

3. The loudspeaker system of claim 2, wherein the three-dimensional ribbed portion includes a plurality of substantially convex grooves each oriented substantially perpendicular to the path of sound waves projected from the at least one high-frequency speaker.

4. The loudspeaker system of claim 3, wherein the width of each of the plurality of substantially convex grooves is within the range of distances determined by one-fourth of the wavelength of sound energy in the 4 kHz to 10 kHz frequency range.

5. The loudspeaker system of claim 3, wherein the depth of each of the plurality of substantially convex grooves is within the range of distances determined by one-eighth of the wavelength of sound energy in the 4 kHz to 10 kHz frequency range.

6. The loudspeaker system of claim 3, wherein the spacing between each of the plurality of substantially convex grooves is within the range of distances determined by one-fourth of the wavelength of sound energy in the 4 kHz to 10 kHz frequency range.

7. The loudspeaker system of claim 2, wherein the three-dimensional ribbed portion projects above the surface of the baffle to a height within the range of distances determined by one-half of the wavelength of sound energy in the 4 kHz to 10 kHz range.

8. The loudspeaker system of claim 1 further comprising at least one low-frequency speaker coupled to the baffle in proximity to the at least one high-frequency speaker, the at least one low-frequency speaker substantially operating at a frequency less than 100 Hz.

9. The loudspeaker system of claim 1 further comprising at least one mid-range frequency speaker coupled to the baffle in proximity to the at least one high-frequency speaker, the at least one mid-range frequency speaker substantially operating at a frequency range between about 100 Hz and 4 kHz.

10. The loudspeaker system of claim 1, wherein the baffle includes a first angled surface and a second angled surface adjoining the first angled surface, the first angled surface and the second angled surface each oriented at an oblique angle with respect to the plane, wherein the at least one high-frequency speaker is coupled to the first angled surface and the means for altering sound waves projected from the at least one high-frequency speaker is coupled to the first angled surface.

11. The loudspeaker system of claim 1, wherein the at least one high-frequency speaker is coupled to the first angled surface and the three-dimensional ribbed portion projected from the at least one high-frequency speaker is coupled to the baffle at least partially along the intersection of the first angled surface and the second angled surface.

12. The loudspeaker system of claim 11 further comprising at least two mid-range frequency speakers coupled to the first angled surface adjacent to the at least one high-frequency speaker, the at least two mid-range frequency speakers each substantially operating at a frequency range between about 100 Hz and 4 kHz.

13. The loudspeaker system of claim 11 further comprising at least two low-frequency speakers coupled to the second angled surface, the at least two low-frequency speakers each substantially operating at a frequency less than 100 Hz.

14. The loudspeaker system of claim 1, wherein the first side and the second side each have a plurality of grooves formed therein to prevent direct reflections of sound energy in the 4 kHz to 10 kHz range, the plurality of grooves each oriented substantially parallel to the first angled surface.

15. The loudspeaker system of claim 1, wherein the plurality of grooves provide an acoustic impedance termination to substantially match sound energy in the 4 kHz to 10 kHz frequency range.

16. The loudspeaker system of claim 1, wherein the first side and the second side each have a portion of acoustic damping material coupled thereto, each portion of acoustic damping material having a plurality of grooves formed therein to prevent direct reflections of sound energy in the 4 kHz to 10 kHz range, the plurality of grooves each oriented substantially parallel to the first angled surface.

17. The loudspeaker system of claim 16, wherein the plurality of grooves provide an acoustic impedance termination to substantially match sound energy in the 4 kHz to 10 kHz frequency range.

18. The loudspeaker system of claim 11 further comprising a curved region formed on the portion of the first angled surface adjacent to the at least one high-frequency speaker and opposite the three-dimensional ribbed portion, the curved region having a substantially convex shape perpendicular to the first angled surface and a substantially concave profile parallel to the first angled surface.

19. The loudspeaker of claim 1, wherein the enclosure contains means for mounting the loudspeaker system to a ceiling or wall.

20. The loudspeaker of claim 1, wherein the enclosure contains means for mounting the loudspeaker system within a vehicle selected from the group of vehicles consisting of a car, a truck, a van, a boat, a motor home, and a bus.

* * * * *